(12) United States Patent
Pradhan et al.

(10) Patent No.: US 9,177,867 B2
(45) Date of Patent: Nov. 3, 2015

(54) TUNGSTEN GATES FOR NON-PLANAR TRANSISTORS

(75) Inventors: Sameer S. Pradhan, Campbell, CA (US); Daniel B. Bergstrom, Lake Oswego, OR (US); Jin-Sung Chun, Hillsboro, OR (US); Julia Chiu, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/993,330

(22) PCT Filed: Sep. 30, 2011

(86) PCT No.: PCT/US2011/054294
§ 371 (c)(1),
(2), (4) Date: Jul. 29, 2014

(87) PCT Pub. No.: WO2013/048449
PCT Pub. Date: Apr. 4, 2013

(65) Prior Publication Data
US 2015/0041926 A1 Feb. 12, 2015

(51) Int. Cl.
*H01L 21/283* (2006.01)
*H01L 21/8238* (2006.01)
*H01L 29/66* (2006.01)
(Continued)

(52) U.S. Cl.
CPC *H01L 21/823828* (2013.01); *H01L 21/823857* (2013.01); *H01L 29/495* (2013.01); *H01L 29/51* (2013.01); *H01L 29/66545* (2013.01); *H01L 29/66795* (2013.01); *H01L 29/785* (2013.01); *H01L 21/76897* (2013.01); *H01L 2029/7858* (2013.01)

(58) Field of Classification Search
CPC ..... H01L 29/66545; H01L 29/66795–29/6681
USPC .......................................... 257/412; 438/230
See application file for complete search history.

(56) References Cited

U.S. PATENT DOCUMENTS 5,399,415 A 3/1995 Chen et al.
6,030,692 A 2/2000 Auger
(Continued)

FOREIGN PATENT DOCUMENTS

JP 2002-184981 A 6/2002
JP 2004-128314 A 4/2004
(Continued)

OTHER PUBLICATIONS

International Preliminary Report on Patentability and Written Opinion received for PCT Patent Application No. PCT/US2011/054294, mailed on Apr. 10, 2014, 5 pages.
(Continued)

*Primary Examiner* — Daniel Shook
(74) *Attorney, Agent, or Firm* — Kathy J. Ortiz

(57) ABSTRACT

The present description relates to the field of fabricating microelectronic devices having non-planar transistors. Embodiments of the present description relate to the formation of gates within non-planar NMOS transistors, wherein an NMOS work-function material, such as a composition of aluminum, titanium, and carbon, may be used in conjunction with a titanium-containing gate fill barrier to facilitate the use of a tungsten-containing conductive material in the formation of a gate electrode of the non-planar NMOS transistor gate.

25 Claims, 14 Drawing Sheets

(51) Int. Cl.
*H01L 29/78* (2006.01)
*H01L 29/49* (2006.01)
*H01L 29/51* (2006.01)
*H01L 21/768* (2006.01)

(56) References Cited

U.S. PATENT DOCUMENTS

| | | | |
|---|---|---|---|
| 6,136,697 A | 10/2000 | Wu | |
| 6,331,481 B1 | 12/2001 | Stamper et al. | |
| 7,456,471 B2 | 11/2008 | Anderson et al. | |
| 7,528,025 B2 | 5/2009 | Brask et al. | |
| 2002/0130372 A1 | 9/2002 | Kwon et al. | |
| 2005/0019993 A1 | 1/2005 | Lee et al. | |
| 2005/0023133 A1 | 2/2005 | Lippitt et al. | |
| 2006/0046449 A1 | 3/2006 | Liaw | |
| 2006/0088967 A1 | 4/2006 | Hsiao et al. | |
| 2006/0099783 A1 | 5/2006 | Gluschenkov et al. | |
| 2006/0157749 A1 | 7/2006 | Okuno | |
| 2006/0189058 A1 | 8/2006 | Lee et al. | |
| 2007/0066184 A1 | 3/2007 | Nagamoto et al. | |
| 2007/0111435 A1 | 5/2007 | Kim et al. | |
| 2008/0001187 A1 | 1/2008 | Booth et al. | |
| 2008/0014710 A1 | 1/2008 | Bian et al. | |
| 2008/0233699 A1 | 9/2008 | Booth et al. | |
| 2009/0142991 A1 | 6/2009 | Moon | |
| 2009/0321841 A1 | 12/2009 | Hoentschel et al. | |
| 2010/0032728 A1 | 2/2010 | Hao et al. | |
| 2010/0048007 A1 | 2/2010 | Lee et al. | |
| 2010/0105215 A1 | 4/2010 | Sugawara et al. | |
| 2010/0155842 A1 | 6/2010 | Anderson et al. | |
| 2011/0034026 A1 | 2/2011 | Sunayama et al. | |
| 2011/0147812 A1 | 6/2011 | Steigerwald et al. | |
| 2011/0147831 A1 | 6/2011 | Steigerwald et al. | |
| 2011/0147851 A1* | 6/2011 | Thomas et al. | 257/369 |
| 2011/0151250 A1 | 6/2011 | Yasuda et al. | |
| 2011/0156107 A1 | 6/2011 | Bohr et al. | |
| 2011/0217541 A1 | 9/2011 | Shimano et al. | |
| 2011/0272739 A1 | 11/2011 | Lee et al. | |
| 2011/0281509 A1 | 11/2011 | Tanaka et al. | |
| 2012/0001266 A1 | 1/2012 | Lim et al. | |
| 2012/0313170 A1 | 12/2012 | Chang et al. | |
| 2013/0062669 A1 | 3/2013 | Chen et al. | |
| 2013/0065371 A1 | 3/2013 | Wei et al. | |
| 2013/0248952 A1 | 9/2013 | Rosenbaum et al. | |
| 2013/0256767 A1 | 10/2013 | Pradhan et al. | |
| 2013/0334713 A1 | 12/2013 | Xu et al. | |
| 2014/0117425 A1 | 5/2014 | Pradhan et al. | |

FOREIGN PATENT DOCUMENTS

| | | | |
|---|---|---|---|
| KR | 10-2004-0050519 A | | 6/2004 |
| KR | 100585178 B1 | | 5/2006 |
| KR | 10-0653711 B1 | | 12/2006 |
| KR | 10-2007-0122319 A | | 12/2007 |
| KR | 20070122319 A | * | 12/2007 |
| KR | 10-2008-0021918 A | | 3/2008 |
| KR | 10-2009-0012793 A | | 2/2009 |
| TW | 201110324 A | | 3/2011 |
| TW | 201123448 A | | 7/2011 |
| TW | 201208078 A | | 2/2012 |
| TW | 201236153 A | | 9/2012 |
| WO | 2011/087571 A1 | | 7/2011 |
| WO | 2011/090571 A2 | | 7/2011 |
| WO | 2013/048449 A1 | | 4/2013 |
| WO | 2013/048516 A1 | | 4/2013 |
| WO | 2013/048524 A1 | | 4/2013 |
| WO | 2013/085490 A1 | | 6/2013 |
| WO | 2013/095527 A1 | | 6/2013 |

OTHER PUBLICATIONS

International Preliminary Report on Patentability and Written Opinion received for PCT Patent Application No. PCT/US2011/054464, mailed on Apr. 10, 2014, 4 pages.
International Preliminary Report on Patentability and Written Opinion received for PCT Patent Application No. PCT/US2011/063433, mailed on Jun. 19, 2014, 10 pages.
International Preliminary Report on Patentability and Written Opinion received for PCT Patent Application No. PCT/US2011/066921, mailed on Jul. 3, 2014, 14 pages.
International Preliminary Report on Patentability and Written Opinion received for PCT Patent Application No. PCT/US2011/054479, mailed on Apr. 10, 2014, 6 pages.
International Search Report and Written Opinion Received for PCT Patent Application No. PCT/US2011/054294, Mailed on May 15, 2012, 8 pages.
International Search Report and Written Opinion Received for PCT Patent Application No. PCT/US2011/054464, Mailed on May 15, 2012, 9 pages.
International Search Report and Written Opinion Received for PCT Patent Application No. PCT/US2011/054479, Mailed on May 16, 2012, 9 pages.
International Search Report and Written Opinion Received for PCT Patent Application No. PCT/US2011/063433, Mailed on Jul. 20, 2012, 9 pages.
International Search Report and Written Opinion Received for PCT Patent Application No. PCT/US2011/066921, Mailed on Sep. 27, 2012, 11 pages.
Office Action received for Korean Patent Application No. 10-2014-7007165, mailed on Apr. 14, 2015, 3 pages of English Translation and 5 pages of Korean Office Action.
Office Action received for Korean Patent Application No. 10-2014-7007872, mailed on Apr. 28, 2015, 4 pages of English Translation and 5 pages of Korean Office Action.
Office Action received for Taiwan Patent Application No. 101133821, mailed on Dec. 25, 2014, 7 pages of English Translation and 9 pages of Taiwan Office Action.
Office Action received for Taiwan Patent Application No. 101133821, mailed on Aug. 6, 2014, 7 pages of English Translation and 9 pages of Taiwan Office Action.
Office Action received for Taiwan Patent Application No. 101134489, mailed on May 1, 2015, 1 page of Search Report and 2 pages of Taiwan Office Action (Official Copy only).
Office Action received for Japanese Patent Application No. 2014-533283, mailed on Feb. 10, 2015, 2 pages of English Translation and 1 page of Japanese Office Action.

* cited by examiner

TUNGSTEN GATES FOR NON-PLANAR TRANSISTORS

BACKGROUND

Embodiments of the present description generally relate to the field of microelectronic device fabrication and, more particularly, to the fabrication of tungsten gates within non-planar transistors.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DETAILED DESCRIPTION

Figure 1:
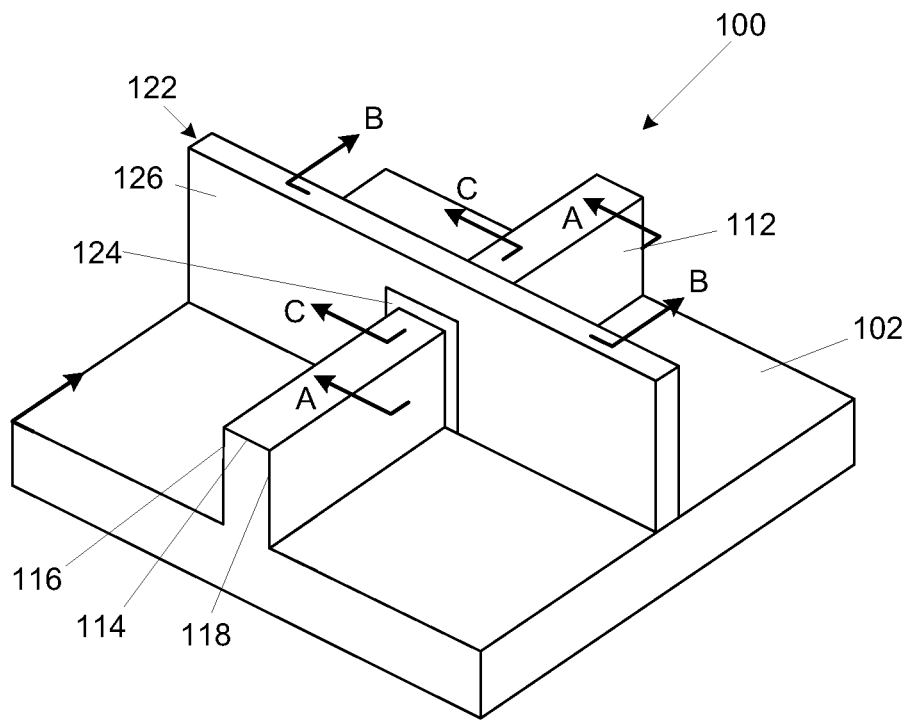
FIG. 1 is a perspective view of a non-planar transistor, according to an embodiment of the present description.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present invention. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

In the fabrication of non-planar transistors, such as tri-gate transistors and FinFETs, non-planar semiconductor bodies may be used to form transistors capable of full depletion with very small gate lengths (e.g., less than about 30 nm). These semiconductor bodies are generally fin-shaped and are, thus, generally referred to as transistor "fins". For example in a tri-gate transistor, the transistor fins have a top surface and two opposing sidewalls formed on a bulk semiconductor substrate or a silicon-on-insulator substrate. A gate dielectric may be formed on the top surface and sidewalls of the semiconductor body and a gate electrode may be formed over the gate dielectric on the top surface of the semiconductor body and adjacent to the gate dielectric on the sidewalk of the semiconductor body. Thus, since the gate dielectric and the gate electrode are adjacent to three surfaces of the semiconductor body, three separate channels and gates are formed. As there are three separate channels formed, the semiconductor body can be fully depleted when the transistor is turned on. With regard to finFET transistors, the gate material and the electrode only contact the sidewalls of the semiconductor body, such that two separate channels are formed (rather than three in tri-gate transistors).

Embodiments of the present description relate to the formation of gates within non-planar transistors, wherein an NMOS work-function material, such as a composition of aluminum, titanium, and carbon, may be used in conjunction with a titanium-containing gate fill barrier to facilitate the use of a tungsten-containing conductive material in the formation of gate electrodes of non-planar transistor gates.

FIG. 1 is a perspective view of a non-planar transistor 100, including at least one gate formed on at least one transistor fin, which are formed on a microelectronic substrate 102. In an embodiment of the present disclosure, the microelectronic substrate 102 may be a monocrystalline silicon substrate. The microelectronic substrate 102 may also be other types of substrates, such as silicon-on-insulator ("SOI"), germanium, gallium arsenide, indium antimonide, lead telluride, indium arsenide, indium phosphide, gallium arsenide, gallium antimonide, and the like, any of which may be combined with silicon.

The non-planar transistor, shown as a tri-gate transistor, may include at least one non-planar transistor fin 112. The non-planar transistor fin 112 may have a top surface 114 and a pair of laterally opposite sidewalls, sidewall 116 and opposing sidewall 118, respectively.

As further shown in FIG. 1, at least one non-planar transistor gate 122 may be formed over the non-planar transistor fin 112. The non-planar transistor gate 122 may be fabricated by forming a gate dielectric layer 124 on or adjacent to the non-planar transistor fin top surface 114 and on or adjacent to the non-planar transistor fin sidewall 116 and the opposing non-planar transistor fin sidewall 118. A gate electrode 126 may be formed on or adjacent the gate dielectric layer 124. In one embodiment of the present disclosure, the non-planar transistor fin 112 may run in a direction substantially perpendicular to the non-planar transistor gate 122.

The gate dielectric layer 124 may be formed from any well-known gate dielectric material, including but not limited to silicon dioxide ($SiO_2$), silicon oxynitride ($SiO_xN_y$), silicon nitride ($Si_3N_4$), and high-k dielectric materials such as hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. The gate dielectric layer 124 can be formed by well-known techniques, such as by conformity depositing a gate dielectric material and then patterning the gate dielectric material with well-known photolithography and etching techniques, as will be understood to those skilled in the art.

The gate electrode 126 may be formed by various embodiments of the present invention, as will be discussed.

A source region and a drain region (not shown in FIG. 1) may be formed in the non-planar transistor fin 112 on opposite sides of the gate electrode 126. In one embodiment, the source and drain regions may be formed by doping the non-planar transistor fins 112, as will be understood to those skilled in the art. In another embodiment, the source and drain regions may be formed by removing portions of the non-planar transistor fins 112 and replacing these portions with appropriate material(s) to form the source and drain regions, as will be understood to those skilled in the art. In still another embodiment, the source and drain regions may be formed by exitaxially growing doped or undoped strain layers on the fins 112.

FIGS. 2-26 illustrate side cross-sectional view of one embodiment of fabricating a non-planar transistor, wherein FIGS. 2-5 are views along arrows A-A and B-B of FIG. 1, FIGS. 6-15 are views along arrows A-A of FIG. 1, and FIG. 16-26 are views along arrows C-C of FIG. 1.

Figure 2:
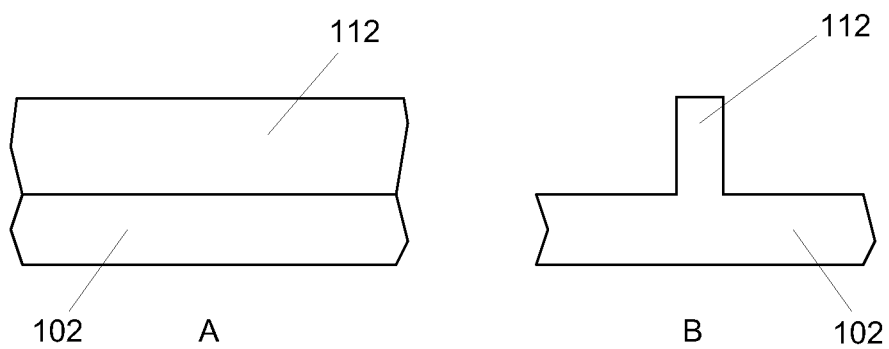
FIG. 2 illustrates a side cross-sectional view of a non-planar transistor fin formed in or on a microelectronic substrate.
Figure 3:
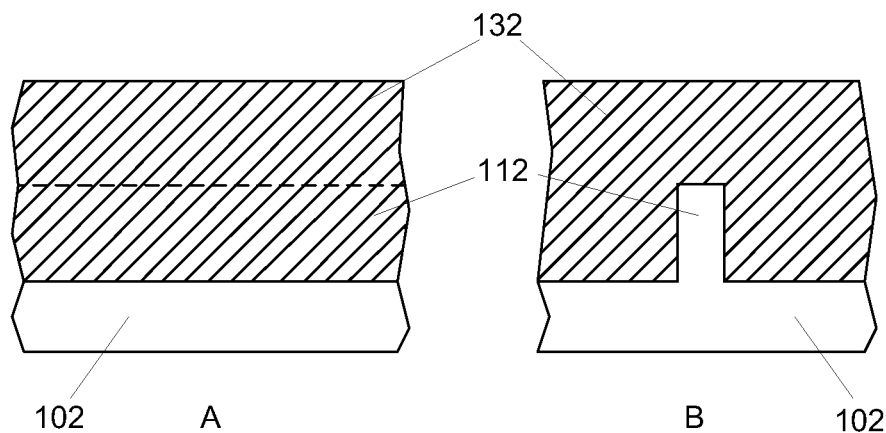
FIG. 3 illustrates a side cross-sectional view of a sacrificial material deposited over the non-planar transistor fin of FIG. 2, according to an embodiment of the present description.
Figure 4:
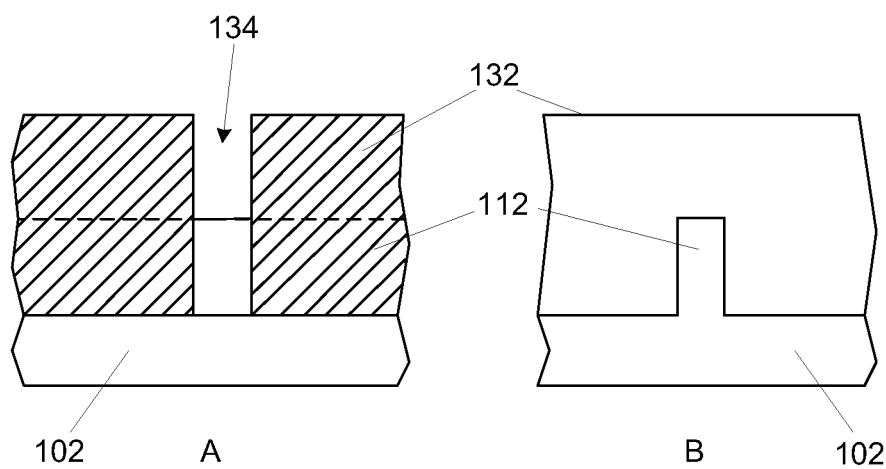
FIG. 4 illustrates a side cross-sectional view of a trench formed in the sacrificial material deposited to expose a portion of the non-planar transistor fin of FIG. 3, according to an embodiment of the present description.

As shown in FIG. 2, the non-planar transistor fin 112 may be formed by etching the microelectronic substrate 102 or by forming the non-planar transistor fin 112 on the microelectronic substrate 102 by any technique known in the art. As illustrated in FIG. 3, a sacrificial material 132 may be deposited over the non-planar transistor fin 112, as shown in FIG. 3, and a trench 134 may be for in the sacrificial material 132 to expose a portion of the non-planar transistor fin 112, as shown in FIG. 4. The sacrificial material 132 may be any appropriate material known in the art, and the trench 134 may be formed by any technique known in the art, including but not limited to lithographic masking and etching.

Figure 5:
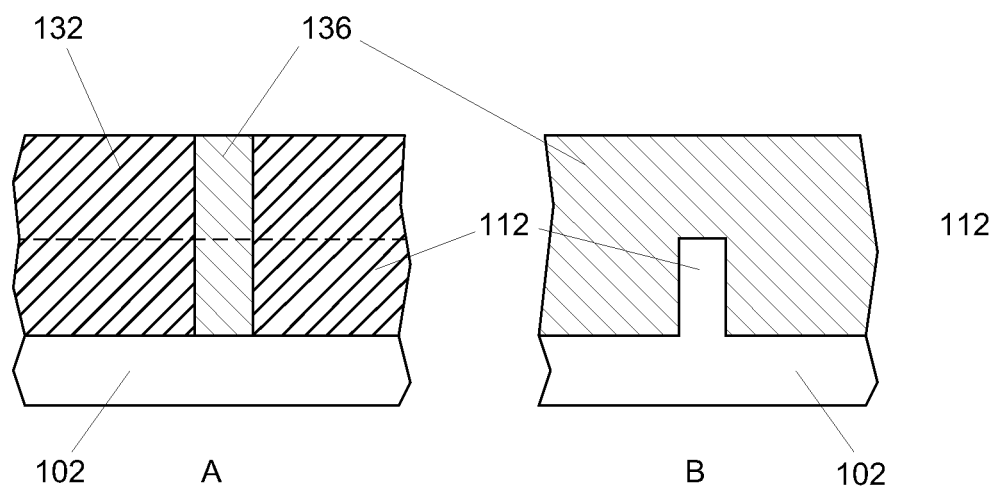
FIG. 5 illustrates a side cross-sectional view of a sacrificial gate formed in the trench of FIG. 4, according to an embodiment of the present description.

As shown in FIG. 5, a sacrificial gate 136 may be formed in the trench 134 (see FIG. 4). The sacrificial gate 136 may be any appropriate material, such as a polysilicon material and the like, and may be deposited in the trench 134 (see FIG. 4) by any technique known in the art, including but not limited to chemical vapor deposition ("CVD") and physical vapor deposition ("PVD").

Figure 6:
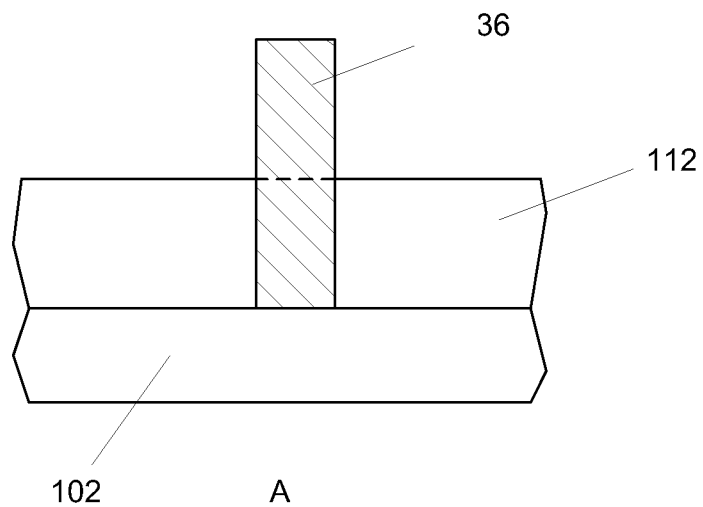
FIG. 6 illustrates a side cross-sectional view of the sacrificial gate after the removal of the sacrificial material of FIG. 5, according to an embodiment of the present description.
Figure 7:
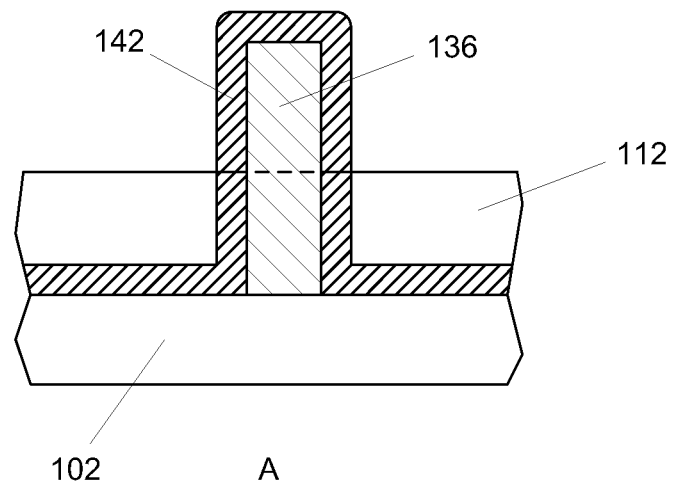
FIG. 7 illustrates a side cross-sectional view of a conformal dielectric layer deposited over the sacrificial gate and microelectronic substrate of FIG. 6, according to an embodiment of the present description.

As shown in FIG. 6, the sacrificial material 132 of FIG. 5 may be removed to expose the sacrificial gate 136 by any technique known in the art, such as selectively etching the sacrificial material 132. As shown in FIG. 7, a conformal dielectric layer 142 may be deposited over the sacrificial gate 136 and microelectronic substrate 102. The conformal dielectric layer 142 may be any appropriate material, including but not limited to silicon nitride ($Si_3N_4$) and silicon carbide (SiC), and may be formed by any appropriate technique including but not limited to atomic layer deposition ("ALD").

Figure 8:
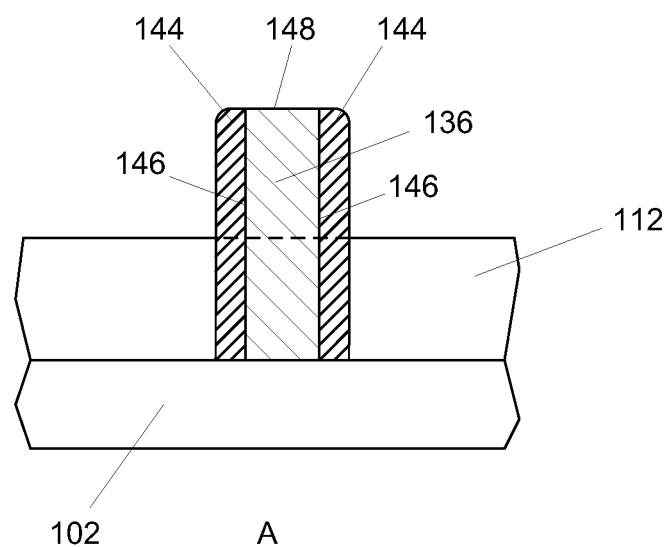
FIG. 8 illustrates a side cross-sectional view of gate spacers formed from the conformal dielectric layer of FIG. 7, according to an embodiment of the present description.

As shown in FIG. 8, the conformal dielectric layer 142 of FIG. 7 may be etched, such as by directional etch with an appropriate etchant, to form a pair of gate spacers 144 on sidewalls 146 of the sacrificial gate 136, while substantially removing the conformal dielectric material layer 142 adjacent the microelectronic substrate 102 and a top surface 148 of the sacrificial gate 136. It is understood that fin spacers (not shown) may be simultaneously formed on sidewalls 116 and 118 (see FIG. 1) of the non-planar transistor fin 112 during the formation of the gate spacers 144.

Figure 9:
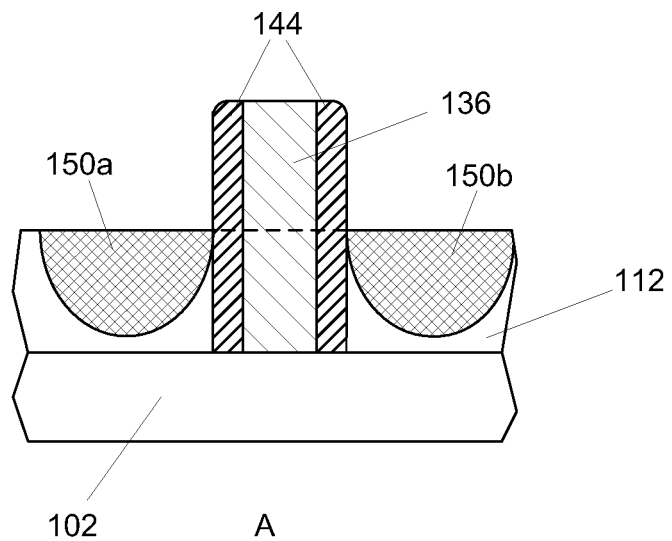
FIG. 9 illustrates a side cross-sectional view of a source region and a drain region finned in the non-planar transistor fin on either side of the gate spacers of FIG. 8, according to an embodiment of the present description.

As shown in FIG. 9, a source region 150a and a drain region 150b may be formed on either side of the gate spacers 144. In one embodiment, the source region 150a and the drain region 150b may be formed in the non-planar transistor fin 112 with the implantation of N-type ion dopants. As will be understood to those skilled in that art, dopant implantation is a process of introducing impurities into semiconducting materials for the purpose changing its conductivity and electronic properties. This is generally achieved by ion implantation of either P-type ions (e.g. boron) or N-type ions (e.g. phosphorus), collectively referred to as "dopants". In another embodiment, portions of the non-planar transistor fin 112 may be removed by any technique known in the art, such as etching, and the source region 150a and the drain region 150b may be formed in place of the removed portions. In still another embodiment, the source and drain regions may be formed by exitaxially growing doped or undoped strain layers on the fins 112. The source region 150a and the drain region will hereinafter be referred to collectively as "source/drain region 150". As will be understood to those skilled in the art, transistors having P-type source and drains are referred to as "PMOS" or "p-channel metal-oxide-semiconductor" transistors, and transistors having N-type source and drains are referred to as "NMOS" or "n-channel metal-oxide-semiconductor" transistors. The present description relates to NMOS transistors. Thus, the source/drain region 150 may be N-type.

Figure 10:
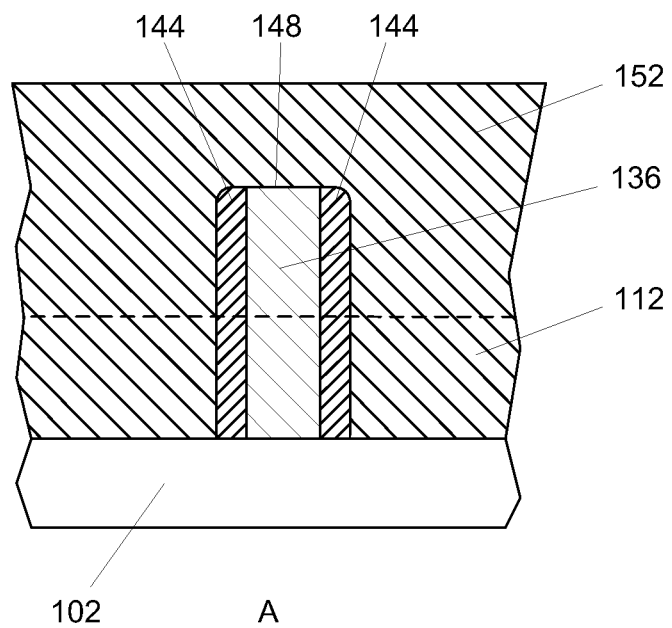
FIG. 10 illustrates a side cross-sectional view of a first dielectric material deposited over the gate spacers, the sacrificial gate, the non-planar transistor fin, and the microelectronic substrate of FIG. 9, according to an embodiment of the present description.
Figure 11:
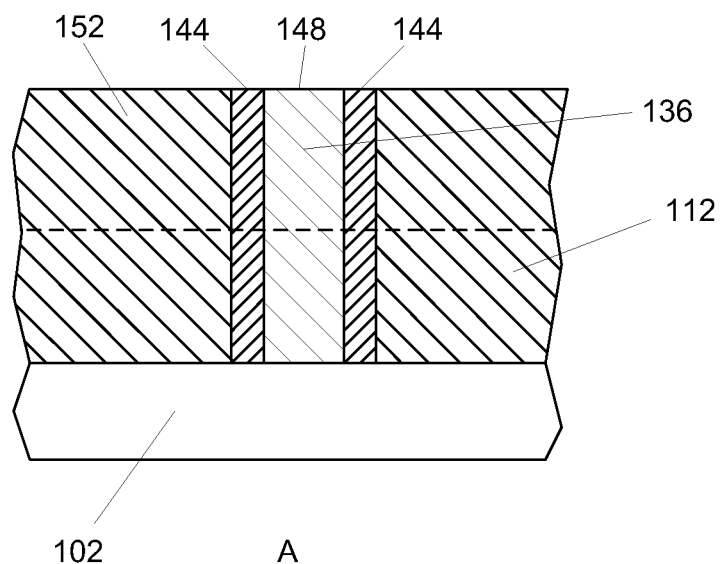
FIG. 11 illustrates a side cross-sectional view of the structure of FIG. 10 after planarizing the first dielectric material to expose a top surface of the sacrificial gate, according to an embodiment of the present description.

As shown in FIG. 10, a first dielectric material layer 152 may be deposited over the gate spacers 144, the sacrificial gate top surface 148, the non-planar transistor fin 112, and the microelectronic substrate 102. The first dielectric material layer 152 may be planarizing to expose the sacrificial gate top surface 148, as shown in FIG. 11. The planarization of the first dielectric material layer 152 may be achieved by any technique known in the art, including but not limited to chemical mechanical polishing (CMP).

Figure 12:
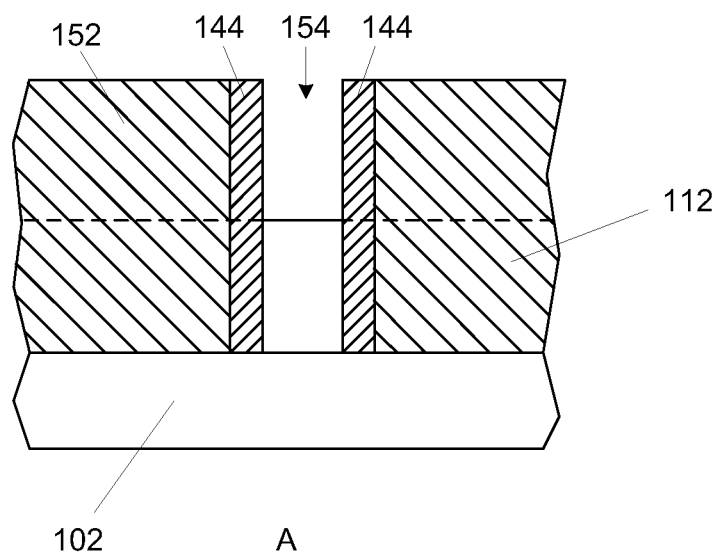
FIG. 12 illustrates a side cross-sectional view of the structure of FIG. 11 after the removal of the sacrificial gate to form a gate trench, according to an embodiment of the present description.
Figure 13:
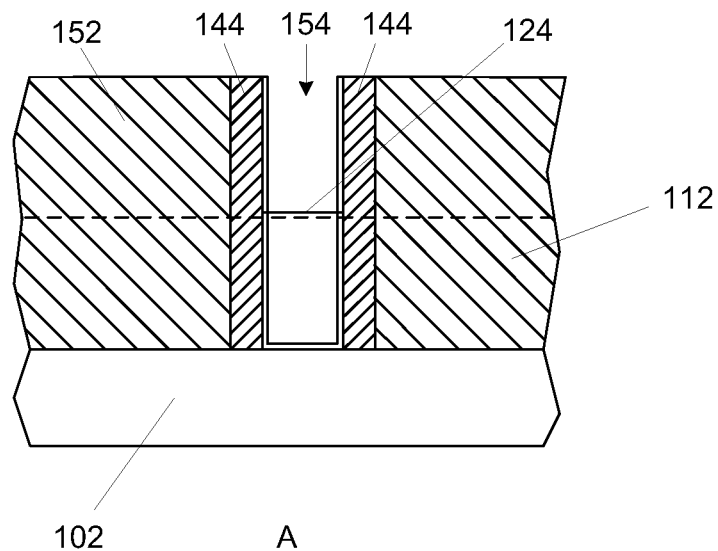
FIG. 13 illustrates a side cross-sectional view of the structure of FIG. 12 after the formation of a gate dielectric adjacent the non-planar transistor fin between the gate spacers, according to an embodiment of the present description.

As shown in FIG. 12, the sacrificial gate 136 of FIG. 11 may be removed to form a gate trench 154. The sacrificial gate 136 may be removed by any technique known in the art, such as a selective etch. As shown in FIG. 13, the gate dielectric layer 124, as also illustrated in FIG. 1, may be formed to abut the non-planar transistor fin 112, as previously discussed. The materials and methods of forming the gate dielectric 124 have been previously discussed.

Figure 14:
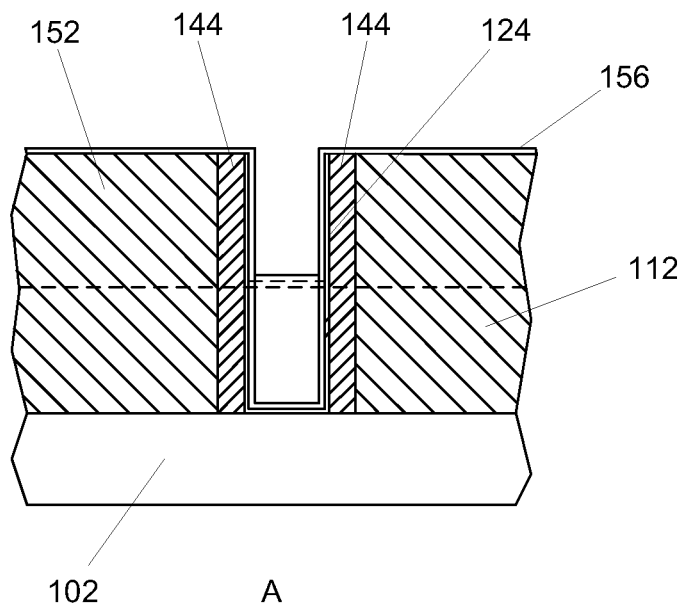
FIG. 14 illustrates a side cross-sectional view of the structure of FIG. 13 after the formation of an NMOS work-function material within the gate trench, according to an embodiment of the present description.

As shown in FIG. 14, an NMOS work-function material 156 may be conformally deposited within the gate trench 154. The NMOS work-function material 156 may comprise a composition including aluminum, titanium, and carbon. In one embodiment, the NMOS work-function material 156 may include between about 20 to 40% by weight aluminum, between about 30 to 50% by weight titanium, and between about 10 to 30% by weight carbon. In a further embodiment, the work-function material may include about 33% by weight aluminum, about 43% by weight titanium, and about 24% by weight carbon. The NMOS work-function material 156 may be conformally deposited by an ALD process to provide good coverage of the non-planar transistor fin 112 and achieve a uniform threshold voltage around the gate trench 154, as will be understood to those skilled in the art. It is further understood that the aluminum to titanium ratio may be adjusted to tune the work function of the non-planar transistor 100, whereas the carbon may be an artifact of the ALD process, rather than an added component.

Figure 15:
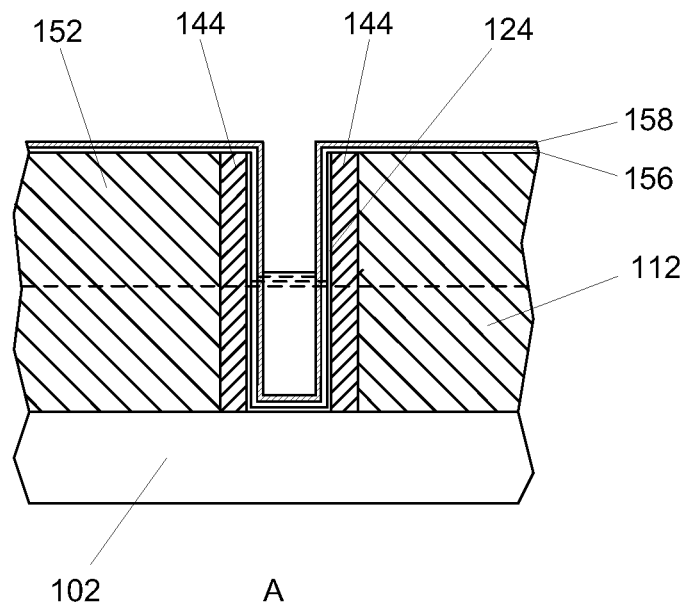
FIG. 15 illustrates a side cross-sectional view of the structure of FIG. 14 after the formation of a gate fill barrier deposited on the NMOS work-function material, according to an embodiment of the present description.

As shown in FIG. 15, a gate fill barrier 158 may be conformally deposited on the NMOS work-function material 156. The gate fill barrier 158 may be a titanium-containing material, including but not limited to substantially pure titanium, titanium nitride, and the like. The gate fill barrier 158 may be formed by any known technique. In one embodiment, the gate fill barrier 158 may be titanium nitride formed by a chemical vapor deposition process comprising the decomposition of tetrakis(dimethylamino)titanium (TDMAT) with plasma densification at about 400° C. In another embodiment, the gate fill barrier 158 may be titanium nitride formed by an atomic layer deposition process comprising pulses of titanium chloride (TiCi) and ammonia ($NH_3$) at about 300° C. In still another embodiment, the gate fill barrier 158 may be a bi-layer of titanium and titanium nitride, wherein a titanium layer maybe formed by physical vapor deposition and the titanium nitride may be formed as discussed above. The gate barrier layer 158 may allow for the use of tungsten hexafluoride to deposit tungsten in a subsequent step to prevent fluorine attack. The use of the titanium layer in the titanium/titanium nitride bi-layer may act as a gettering agent for any fluorine that may diffuse through the titanium nitride layer.

Figure 16:
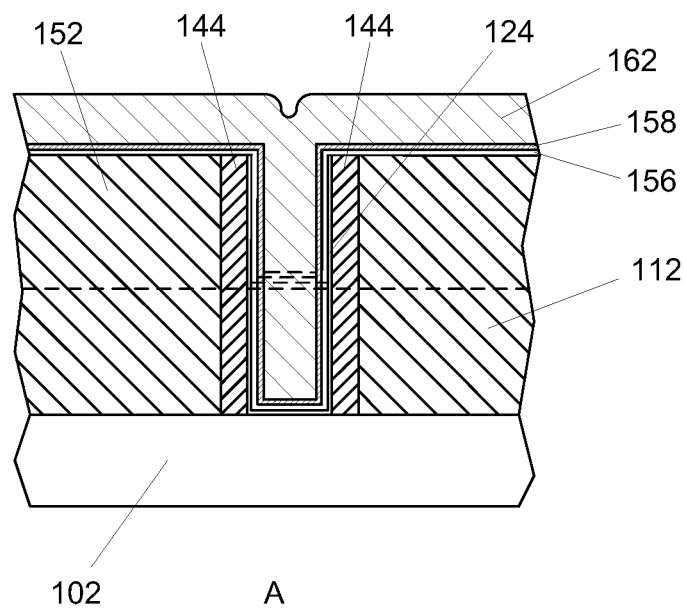
FIG. 16 illustrates a side cross-sectional view of a conductive gate material deposited in the gate trench of FIG. 15, according to an embodiment of the present description.

As shown in FIG. 16, a tungsten gate fill material 162 may be deposited on the gate fill barrier 158. The tungsten gate fill material 162 may be formed by any technique known in the art. In one embodiment, a nucleation layer may be formed, such as pulsed diborane and tungsten hexafluoride at about 300° C., followed by bulk tungsten grown by a tungsten hexafluoride reacting with hydrogen at about 395° C. In one embodiment, the tungsten gate fill material 162 is a tungsten-containing material. In another embodiment, the tungsten gate fill material 162 is substantially pure tungsten.

Figure 17:
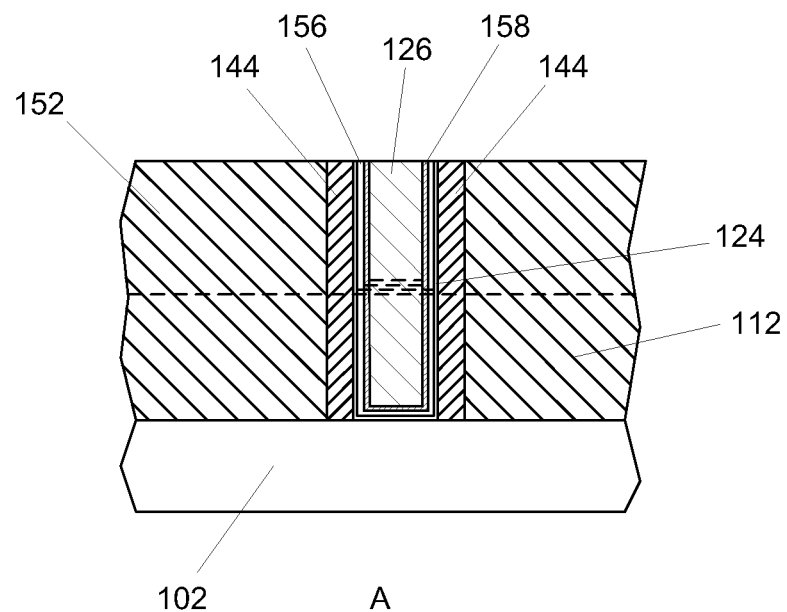
FIG. 17 illustrates a side cross-sectional view of the structure of FIG. 16 after the removal of excess conductive gate material to form a non-planar transistor gate, according to an embodiment of the present description.

Excess tungsten gate fill material 162 (e.g. tungsten gate fill material 162 not within the gate trench 154 of FIG. 16) may be removed to form the non-planar transistor gate electrode 126 (see also FIG. 1), as shown in FIG. 17. The removal of the excess tungsten gate fill material 162 may be achieved by any technique known in the art, including but not limited to chemical mechanical polishing (CMP), etching, and the like.

Figure 18:
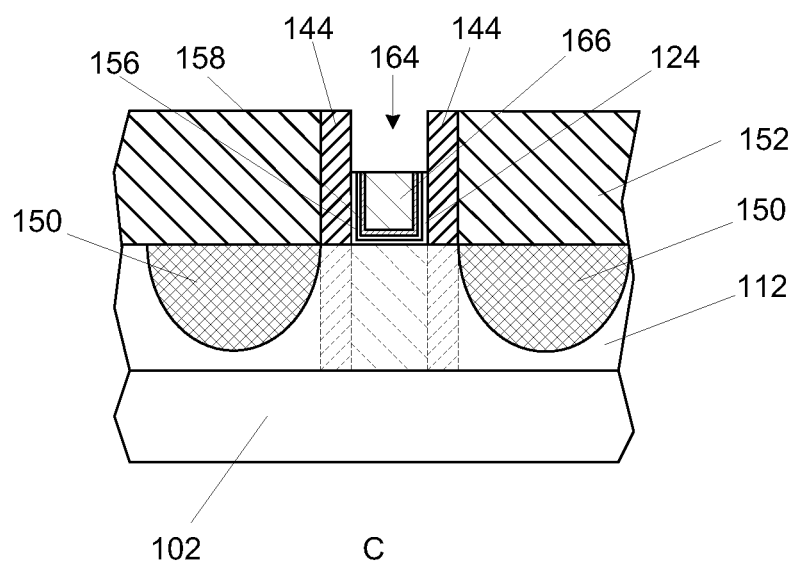
FIG. 18 illustrates a side cross-sectional view of the structure of FIG. 17 after etching away a portion of the non-planar transistor gate to form a recessed non-planar transistor gate, according to an embodiment of the present description.

As shown in FIG. 18, a portion of the non-planar transistor gate electrode 126 may be removed to form a recess 164 and a recessed non-planar transistor gate 166. The removal may be accomplished by any known technique, including but not limited to wet or dry etching. In one embodiment, the formation of the recess may result from a combination of a dry etch and a wet etch. For example, the tungsten gate fill material 62 may be recessed with a sulfur hexafluoride dry etch and the NMOS work-function material 156 may be recessed with a subsequent wet etch.

Figure 19:
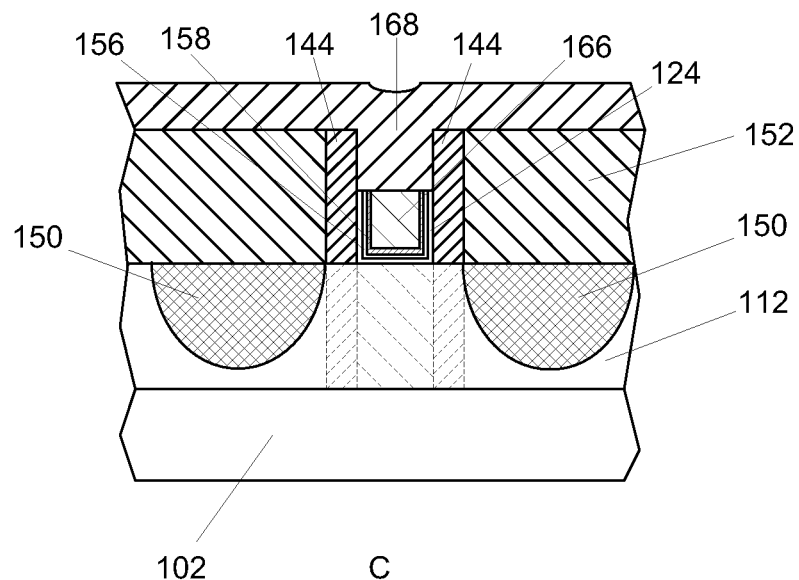
FIG. 19 illustrates a side cross-sectional view of the structure of FIG. 18 after depositing a capping dielectric material into the recess resulting from the formation of the recessed non-planar transistor gate, according to an embodiment of the present description.
Figure 20:
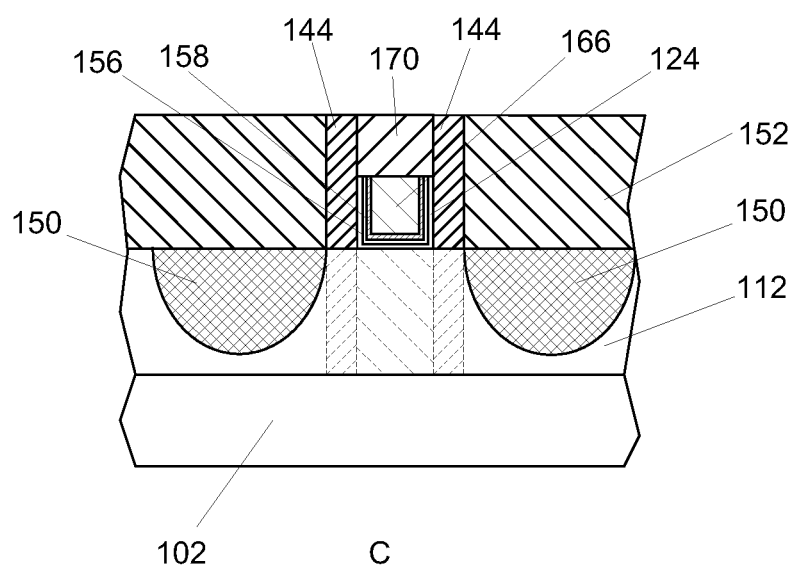
FIG. 20 illustrates a side cross-sectional view of the structure of FIG. 19 after the removal of excess capping dielectric material to form a capping structure on the non-planar transistor gate, according to an embodiment of the present description.

As shown in FIG. 19, a capping dielectric material 168 may be deposited to fill the recess 164 of FIG. 18. The capping dielectric material 168 may be any appropriate material, including but not limited to silicon nitride ($Si_3N_4$) and silicon carbide (SiC), and may be formed by any appropriate deposition technique. The capping dielectric material 168 may be planarized to remove excess capping dielectric material 168 (e.g. capping dielectric material 168 not within the recess of FIG. 16) to form a capping dielectric structure 170 on the recessed non-planar transistor gate 166 and between a gate spacers 144, as shown in FIG. 20. The removal of the excess capping dielectric material 168 may be achieved by any technique known in the art, including but not limited to chemical mechanical polishing (CMP), etching, and the like.

Figure 21:
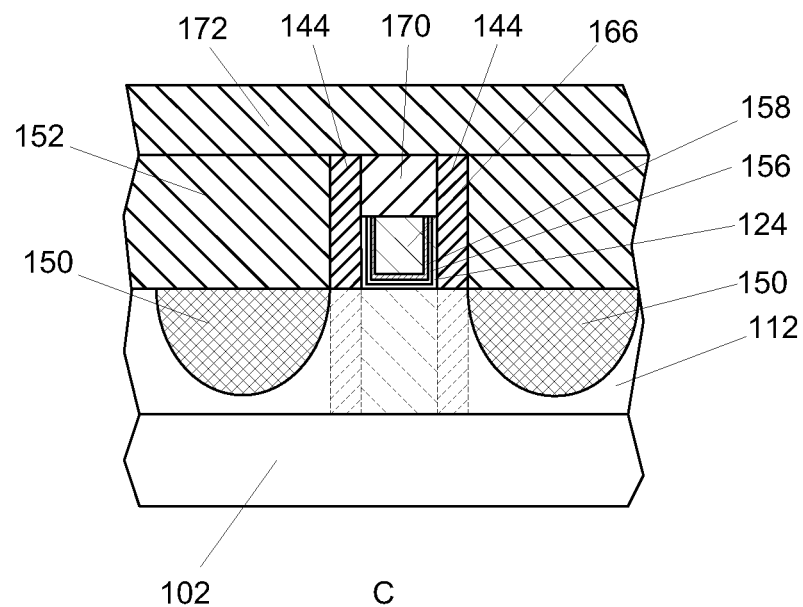
FIG. 21 illustrates a side cross-sectional view of a second dielectric material deposited over the first dielectric material layer, the gate spacers, and the sacrificial gate top surface of FIG. 20, according to an embodiment of the present description.
Figure 22:
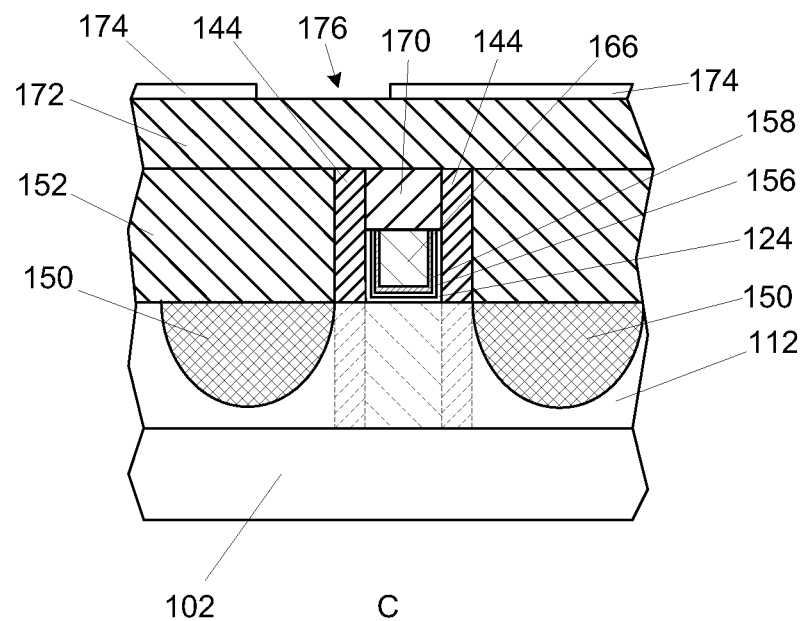
FIG. 22 illustrates a side cross-sectional view of an etch mask patterned on the second dielectric material of FIG. 21, according to an embodiment of the present description.

As shown in FIG. 21, a second dielectric material layer 172 may be deposited over the first dielectric material layer 152, the gate spacers 144, and the capping dielectric structure 170. The second dielectric material layer 172 may be formed from any appropriate dielectric material, including but not limited to silicon dioxide ($SiO_2$), silicon oxynitride ($SiO_xN_y$), and silicon nitride ($Si_3N_4$), by any known deposition technique. As shown in FIG. 22, an etch mask 174 may be patterned with at least one opening 176 on the second dielectric material layer 172, such as by well known lithographic techniques.

Figure 23:
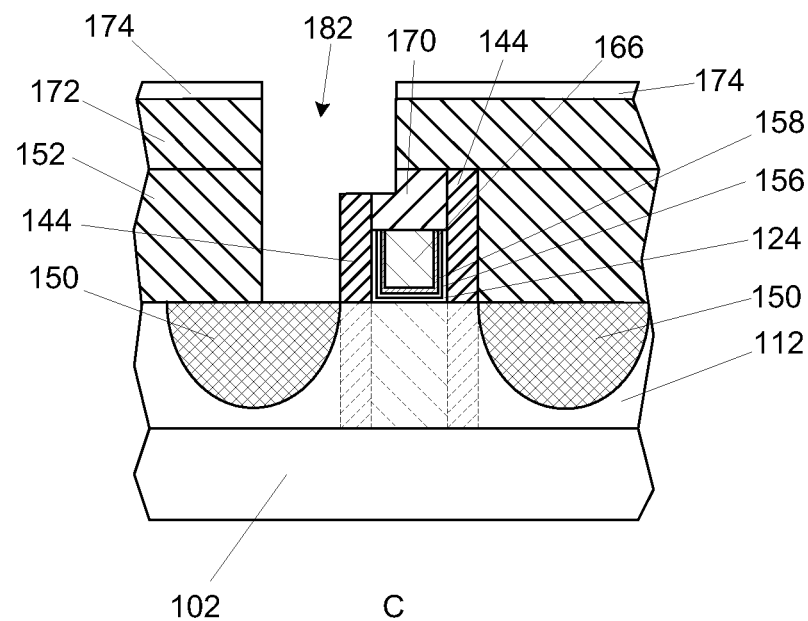
FIG. 23 illustrates a side cross-sectional view of a contact opening formed through the first and second dielectric material layer of FIG. 22, according to an embodiment of the present description.
Figure 24:
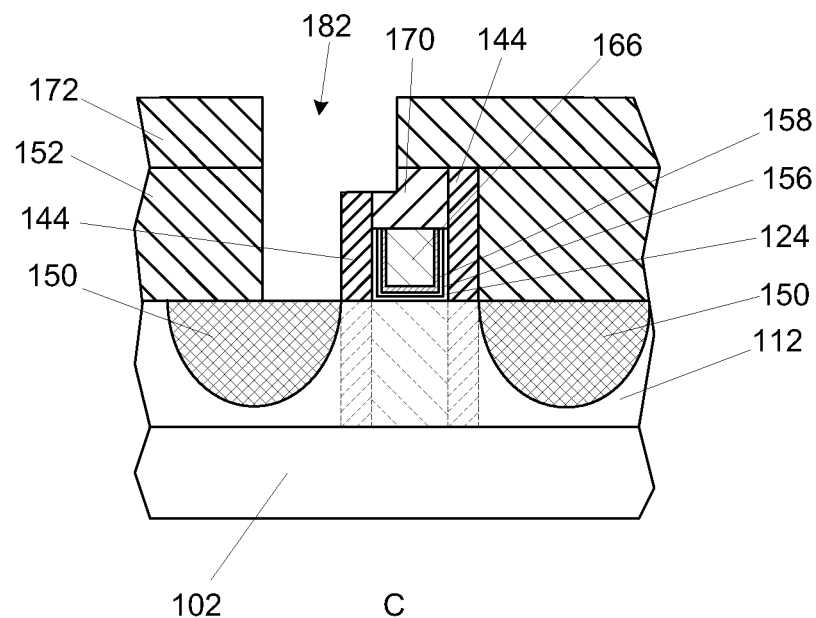
FIG. 24 illustrates a side cross-sectional view of the structure of FIG. 23 after the removal of the etch mask, according to an embodiment of the present description.

As shown in FIG. 23, a contact opening 182 may be formed through the first dielectric material layer 152 and the second dielectric material layer 172 by etching through the etch mask opening 176 of FIG. 24 to expose a portion of the source/drain region 150. The etch mask 174 of FIG. 23 may be removed thereafter, as shown in FIG. 24. In one embodiment, the first dielectric material layer 152 and the second dielectric material layer 172 differs from dielectric material of both the gate spacers 144 and the capping dielectric structure 170, such that the etching of the first dielectric material layer 152 and the second dielectric layer 172 may be selective to the gate spacers 144 and the capping dielectric structure 170 (i.e. etches faster). This is known in the art as a self-aligning.

Figure 25:
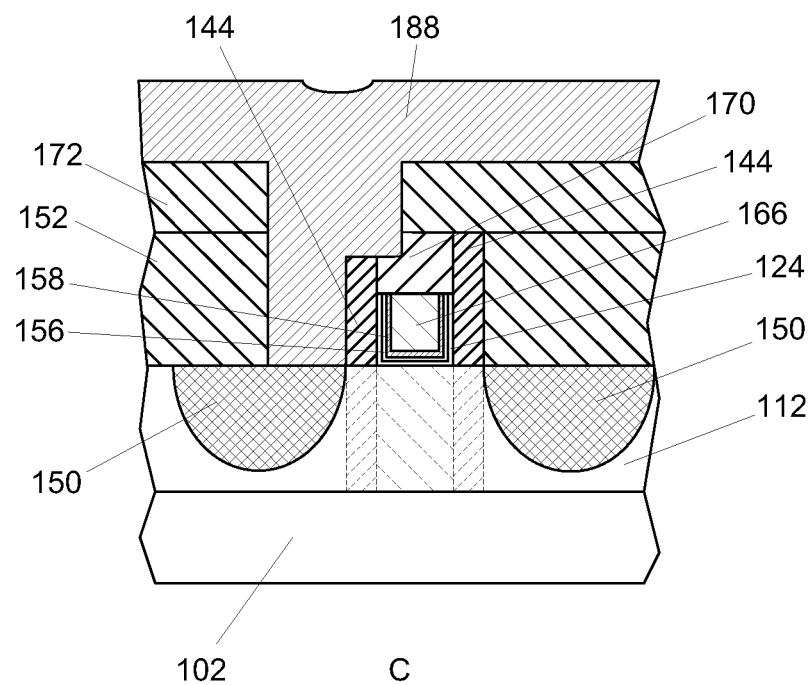
FIG. 25 illustrates a side cross-sectional view of a conductive contact material deposited in the contact opening of FIG. 24, according to an embodiment of the present description.

As shown in FIG. 25, a conductive contact material 188 may be deposited in the contact opening 182 of FIG. 23. The conductive contact material 188 may include, but is not limited to, polysilicon, tungsten, ruthenium, palladium, platinum, cobalt, hafnium, zirconium, titanium, tantalum, aluminum, titanium carbide, zirconium carbide, tantalum carbide, hafnium carbide, aluminum carbide, other metal carbides, metal nitrides, and metal oxides. It is understood that various adhesion layers, barrier layers, silicide layers, and/or conductive layers may be conformally disposed or formed in the contact opening 182 of FIG. 23 prior to the deposition of the conductive contact material 188.

Figure 26:
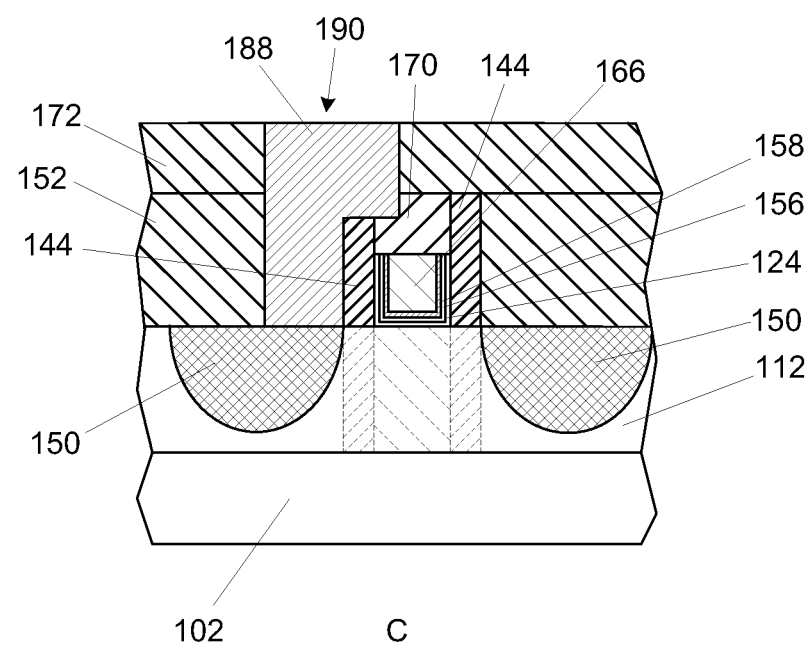
FIG. 26 illustrates a side cross-sectional view of the structure of FIG. 25 after the removal of the excess conductive contact material to form a source/drain contact, according to an embodiment of the present description.
Figure 27:
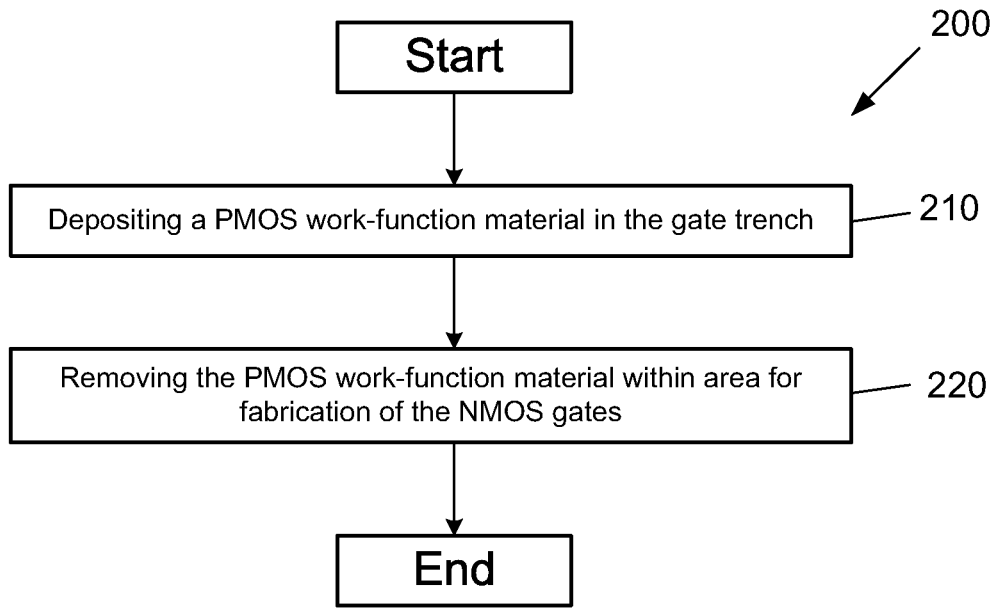
FIG. 27 is a flow diagram of a process of forming a non-planar transistors, according to an embodiment of the present description.

As shown in FIG. 26, excess conductive contact material 188 of FIG. 27 (e.g. conductive contact material 188 not within the contact opening 182 of FIG. 24) may be removed to form a source/drain contact 190. The removal of the excess conductive contact material 188 may be achieved by any technique known in the art, including but not limited to chemical mechanical polishing (CMP), etching, and the like.

As previously discussed, in one embodiment, the first dielectric material layer 152 and the dielectric material layer 168 differs from dielectric material of both the gate spacers 144 and the capping dielectric structure 166, such that the etching of the first dielectric material layer 152 and the second dielectric layer 168 may be selective to the gate spacers 144 and the capping dielectric structure 166 (i.e. etches faster).

Thus, the recessed non-planar transistor 162 is protected during the formation of the contact opening 182. This allows for the formation of a relatively large sized source/drain contact 190, which may increase the transistor drive current performance, without the risk of shorting between the source/drain contact 190 and the recessed non-planar transistor gate 162.

Although the present description relates to non-planar NMOS transistors, it is understood that integrated circuitry into which the non-planar NMOS transistor are incorporated may also include non-planar PMOS transistors. Thus, the process of fabricating non-planar NMOS transistors may be incorporated into an overall integrated circuitry fabrication process.

In one embodiment, as shown in the process 200 of flow diagram in FIG. 27, after the formation of the structures from FIG. 2-13, a PMOS work-function material, such as titanium nitride, may be deposited in the gate trench, as defined in block 210. As defined in block 220, a portion the PMOS work-function material, within areas for fabrication of NMOS gates may be removed, such as by resist patterning and etching, as known in the art. The process may then be continued starting at FIG. 14, such as leaving the patterned resist in place while depositing the NMOS work-function material.

Figure 28:
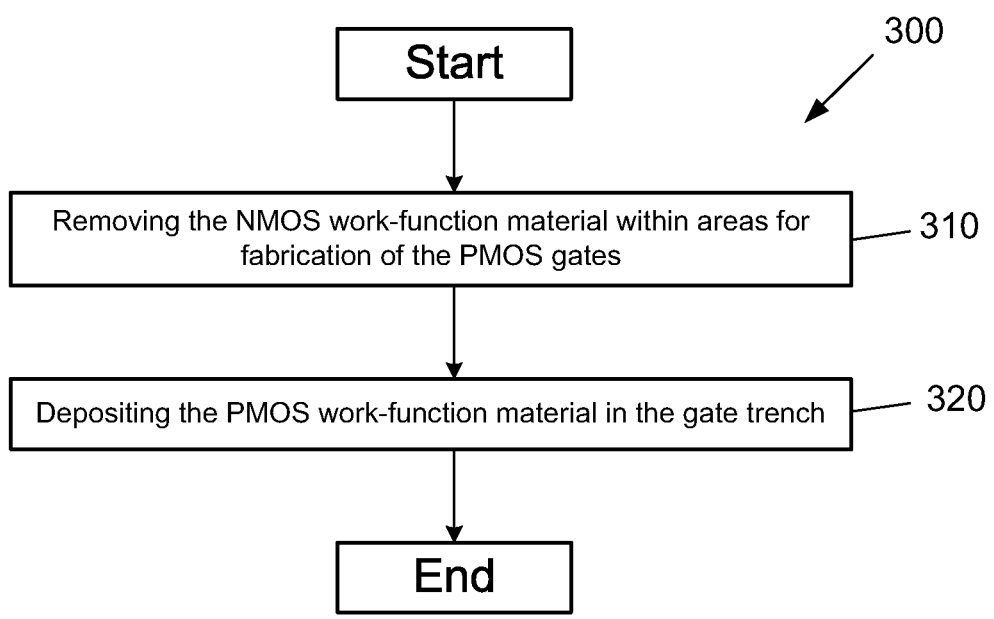
FIG. 28 is a flow diagram of a process of forming a non-planar transistors, according to another embodiment of the present description.

In one embodiment, as shown in the process 300 of flow diagram in FIG. 28, after the formation of the structures from FIG. 2-14, a portion of the NMOS work-function material within areas for fabrication of PMOS gates may be removed, such as by resist patterning and etching, as known in the art. As define in block 310, a PMOS work-function material, such as titanium nitride, may be deposited in the gate trench, as defined in block 320. The process may then be continued starting at FIG. 15. It is understood that the separate formation of the gate fill barrier 158, as shown in FIG. 15, may not be required as the PMOS work-function deposited in block 310 may also serve as the gate fill barrier 158.

It is understood that the subject matter of the present description is not necessarily limited to specific applications illustrated in FIGS. 1-28. The subject matter may be applied to other microelectronic device fabrication applications, as will be understood to those skilled in the art.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. A transistor gate, comprising:
    a pair of gate spacers; and
    a gate electrode disposed between the pair of gate spacers, wherein the gate electrode includes:
        an NMOS work-function material adjacent at least a portion of the pair of gates spacers and comprising aluminum, titanium, and carbon;
        a titanium-containing gate fill barrier adjacent the NMOS work-function material; and
        a tungsten-containing gate fill material adjacent the gate fill barrier.

2. The transistor gate of claim 1, wherein the gate electrode is non-planar.

3. The transistor gate of claim 1, wherein the NMOS work-function material comprises between about 20 to 40% by weight aluminum, between about 30 to 50% by weight titanium, and between about 10 to 30% by weight carbon.

4. The transistor gate of claim 1, wherein the NMOS work-function material comprises about 33% by weight aluminum, about 43% by weight titanium, and about 24% by weight carbon.

5. The transistor gate of claim 1, further including a capping dielectric structure disposed adjacent the non-planar gate electrode and between the pair of gate spacers.

6. A method of fabricating a transistor gate, comprising:
   forming a pair of gate spacers; and
   forming a gate electrode disposed between the pair of gate spacers comprising
      conformally depositing an NMOS work-function material adjacent the pair of gates spacers and comprising aluminum, titanium, and carbon;
      conformally depositing a titanium-containing gate fill barrier adjacent the NMOS work-function material; and
      depositing a tungsten-containing gate fill material adjacent the gate fill barrier.

7. The method of claim 6, wherein conformally depositing the NMOS work-function material comprises conformally depositing the NMOS work-function material having a composition between about 20 to 40% aluminum, between about 30 to 50% titanium, and between about 10 to 30% carbon.

8. The method of claim 7, wherein conformally depositing the NMOS work-function material comprises conformally depositing the NMOS work-function material having a composition of about 33% by weight aluminum, about 43% by weight titanium, and between about 24% by weight carbon.

9. The method of claim 6, further including:
   conformally depositing a PMOS work-function material adjacent the pair of gates spacers; and
   removing a portion of the PMOS work-function material within areas for fabrication of the NMOS gate electrode prior to depositing the NMOS work-function material.

10. The method of claim 9, wherein conformally depositing the PMOS work-function material comprises conformally depositing a titanium nitride PMOS work-function material.

11. The method of claim 6, further including:
    removing a portion of the NMOS work-function material within areas for fabrication of PMOS gate electrodes; and
    conformally depositing a PMOS work-function material adjacent the pair of gates spacers and on the NMOS work-function material within areas for fabrication of the NMOS gate electrodes.

12. The method of claim 11, wherein conformally depositing the PMOS work-function material comprises conformally depositing a titanium nitride PMOS work-function material.

13. The method of claim 6, further including:
    removing a portion of the NMOS work-function material within areas for fabrication of PMOS gate electrodes; and
    conformally depositing a titanium-containing layer as a gate fill barrier adjacent the NMOS work-function material within areas for fabrication of the NMOS gate electrodes and as a PMOS work-function material within areas for fabrication of PMOS gate electrodes.

14. The method of claim 13, wherein conformally depositing a titanium-containing layer comprises conformally depositing a titanium nitride layer.

15. The method of claim 6, further including funning a capping dielectric structure disposed adjacent the non-planar gate electrode and between the pair of gate spacers.

16. The method of claim 15, wherein forming a capping dielectric structure disposed adjacent the non-planar gate electrode and between the pair of gate spacers, comprises:
    forming a recess between the gate spacers by removing a portion of the gate electrode; and
    depositing a capping dielectric material within the recess.

17. A method of fabricating a non-planar transistor gate, comprising:
    forming a sacrificial non-planar transistor gate over a non-planar transistor fin;
    depositing a dielectric material layer over the sacrificial non-planar transistor gate and the non-planar transistor tin;
    forming non-planar transistor gate spacers from a portion of the dielectric material layer adjacent the sacrificial non-planar transistor gate;
    forming a source/drain region;
    removing the sacrificial non-planar transistor gate to form a gate trench between the non-planar transistor gate spacers and expose a portion of the non-planar transistor fin;
    forming a gate dielectric adjacent the non-planar transistor fin within the gate trench;
    forming a gate electrode disposed between the pair of gate spacers, comprising
       conformally depositing an NMOS work-function material adjacent the pair of gates spacers and comprising aluminum, titanium, and carbon;
       conformally depositing a titanium-containing gate fill barrier adjacent the NMOS work-function material; and
       depositing a tungsten-containing gate fill material adjacent the gate fill barrier;
    removing a portion of the gate electrode to form a recess between the non-planar transistor gate spacers;
    forming a capping dielectric structure within the recess;
    forming at least one dielectric material layer over the source/drain region, the non-planar transistor gate spacers, and the capping dielectric structure; and
    forming a contact opening through the at least one dielectric material to contact at least a portion of the source/drain region.

18. The method of claim 17, wherein conformally depositing the NMOS work-function material comprises conformally depositing the NMOS work-function material having a composition between about 20 to 0.40% by weight aluminum, between about 30 to 50% by weight titanium, and between about 10 to 30% by weight carbon.

19. The method of claim 17, wherein conformally depositing the NMOS work-function material comprises conformally depositing the NMOS work-function material having a composition of about 33% by weight aluminum, about 43% by weight titanium, and between about 24% by weight carbon.

20. The method of claim 17, further including:
    conformally depositing a PMOS work-function material adjacent the pair of gates spacers; and
    removing a portion of the PMOS work-function material within areas for fabrication of the NMOS gate electrode prior to depositing the NMOS work-function material.

21. The method of claim 20, wherein conformally depositing the PMOS work-function material comprises conformally depositing a titanium nitride PMOS work-function material.

22. The method of claim 17, further including:
  removing a portion of the NMOS work-function material within areas for fabrication of PMOS gate electrodes; and
  conformally depositing a PMOS work-function material adjacent the pair of gates spacers and on the NMOS work-function material within areas for fabrication of the NMOS gate electrodes.

23. The method of claim 22, wherein conformally depositing the PMOS work-function material comprises conformally depositing a titanium nitride PMOS work-function material.

24. The method of claim 22, wherein conformally depositing a titanium-containing gate fill barrier comprises conformally depositing a titanium nitride layer.

25. The method of claim 17, further including:
  removing a portion of the NMOS work-function material within areas for fabrication of PMOS gate electrodes; and
  conformally depositing a titanium-containing layer as a gate fill barrier adjacent the NMOS work-function material within areas for fabrication of the NMOS gate electrodes and as a PMOS work-function material within areas for fabrication of PMOS gate electrodes.

* * * * *